United States Patent [19]

Hino

[11] Patent Number: 5,399,998
[45] Date of Patent: Mar. 21, 1995

[54] DIGITAL FM MODULATOR

[75] Inventor: Mutsumi Hino, Tokyo, Japan

[73] Assignee: NEC Corporation, Japan

[21] Appl. No.: 977,614

[22] Filed: Nov. 17, 1992

[30] Foreign Application Priority Data

Nov. 18, 1991 [JP] Japan ................................. 3-301975

[51] Int. Cl.$^6$ ............................................. H03C 3/00
[52] U.S. Cl. ................................... 332/127; 332/117;
332/123; 332/126; 332/101; 331/1 R
[58] Field of Search ........................... 331/1 R, 23, 34;
332/117, 126, 127, 100, 101, 128, 124, 102, 123;
375/59, 62, 60, 44; 455/110, 113; 328/14;
377/55

[56]  References Cited

U.S. PATENT DOCUMENTS 4,878,035  10/1989  Vendely et al. ..................... 332/101
5,028,887   7/1991  Gilmore ................................ 331/18

FOREIGN PATENT DOCUMENTS 0026557    3/1978  Japan ................................... 332/127
58-182902  10/1983  Japan .
0148204    8/1985  Japan ................................... 332/127
62-266903  11/1987  Japan ................................... 332/117

Primary Examiner—Robert J. Pascal
Assistant Examiner—Arnold Kinkead
Attorney, Agent, or Firm—Laff, Whitesel, Conte & Saret, Ltd.

[57]  ABSTRACT

An A/D converter (1) converts analog modulation signals, such as video signals and audio signals, into digital modulation signals. A center frequency data setting circuit (6) outputs center frequency data for setting the center frequency of an FM wave. An operation unit (5) outputs such addition data, on the basis of the center frequency data and average frequency data from a counter circuit (4) as will make the average frequency of the FM wave substantially identical with the center frequency that has been set. An adder (2) adds the digital modulation signals and the addition data, and outputs addition digital signals. A DDS (3) accumulates an addition digital signal in every sampling period supplied from a reference oscillator (7). In the ROM (32) of the DDS (3) are stored sine wave data and the ROM (32), having the accumulated signals as its address input, outputs the sine wave data. The counter circuit (4) figures out the average frequency of the FM wave from the DDS (3), and supplies average frequency data to the operation unit (5).

1 Claim, 2 Drawing Sheets

DIGITAL FM MODULATOR

BACKGROUND OF THE INVENTION

The present invention relates to a digital FM modulator, and more particularly to a digital FM modulator to be used for transmitting video signals and audio signals over a frequency modulated (FM) wave.

A digital FM modulator excelling in frequency stability consists of an analog-to-digital (A/D) converter, an adder and a direct digital synthesizer (DDS) as described, for instance in JP-A-62-266903. The A/D converter converts such analog modulation signals as video signals and audio signals into digital modulation signals. The adder adds the digital modulation signals to addition data for setting the center frequency of the FM wave, and supplies added digital signals. The DDS, comprising an accumulator and a read only memory (ROM), accumulates the added digital signals in every sampling period. The accumulated signal becomes an address signal to the ROM, from which a sine wave corresponding to the FM wave is outputted.

Such a digital FM modulator can set the center frequency of the FM wave as addition data, and can determine the frequency stability merely by the accuracy of a reference oscillator which determines the sampling period.

However, with this digital FM modulator, if the frequency, amplitude or the like of the modulation signals, which are the input signals, varies, data of the added digital signals will also vary because the addition data are the same. As a consequence, the average frequency of the FM wave would deviate from the center frequency of the FM wave, resulting in a deterioration in frequency stability. There would also arise the problem of interference with adjoining channels.

SUMMARY OF THE INVENTION

An object of the present invention, therefore, is to provide a digital FM modulator improved in frequency stability.

Another object of the invention is to provide a digital FM modulator for making the average frequency of the FM wave substantially the same as the center frequency of same irrespective of the frequency, amplitude or the like of inputted modulation signals.

According to the invention, there is provided a digital FM modulator capable of so adjusting the addition data to be added to digital modulation signals as to make the average frequency of the FM wave substantially identical with the center frequency of same.

A digital FM modulator according to one aspect of the invention is equipped with means for adding a modulation signal and the center frequency data of a frequency modulated (FM) wave, and supplying an addition signal; means for receiving the inputting of said addition signal, and outputting said FM wave; and control means for so controlling said center frequency data as to make the average frequency and the center frequency of said FM wave substantially identical with each other.

A digital FM modulator according to another aspect of the invention is equipped with means for adding a digital modulation signal and addition data, and supplying an addition digital signal; first means for receiving the inputting of said addition digital signal, and outputting an FM wave; second means for figuring out the average frequency of said FM wave from the output of said first means, and outputting average frequency data; and third means for controlling said center frequency data with a compensatory value obtained by comparing center frequency data for setting the center frequency of said FM wave and said average frequency, and outputting said addition data.

DETAILED DESCRIPTION OF THE PREFERRED EMBODIMENT

Next will be described the present invention in detail with reference to the drawings.

Figure 1:
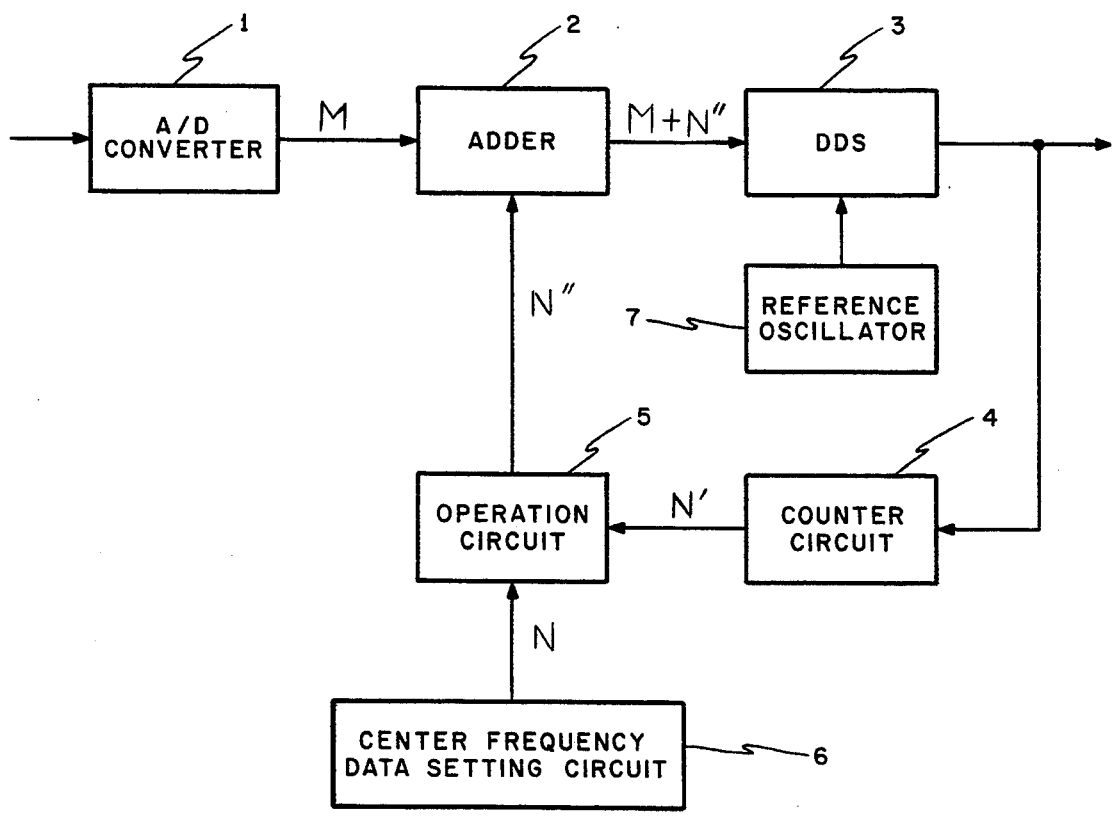
FIG. 1 is a configurative block diagram illustrating a preferred embodiment of the present invention.

A digital FM modulator according to the invention, illustrated in FIG. 1, primarily consists of an analog-to-digital (A/D) converter 1, an adder 2, a direct digital synthesizer (DDS) 3, a counter circuit 4 and an operation unit 5. The digital FM modulator further has a center frequency data setting circuit 6 and a reference oscillator 7.

The A/D converter 1 receives the inputting of analog modulation signals, such as video signals and audio signals, and converts them into digital modulation signals M. The adder 2 adds the digital modulation signals M and addition data N", indicating the center frequency of the frequency modulated (FM) signals and containing a compensated value of a deviation from the center frequency of the FM signals, from the operation unit 5, and outputs the resultant addition digital signals M+N".

Figure 2:
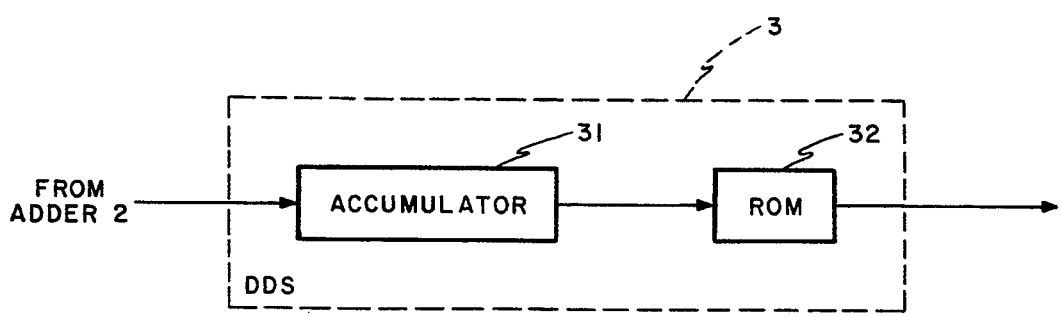
FIG. 2 is an internal block diagram of the direct digital synthesizer (DDS) in FIG. 1.

The DDS 3 consists of an accumulator 31 and a read only memory (ROM) 32 as shown in FIG. 2. The accumulator 31 accumulates an addition digital signal M+N" in every sampling period 1/fc of the reference oscillator 7. In the ROM 32 are stored sine wave data. The ROM 32 has the accumulated signals from the accumulator 31 as its address input, and outputs the sine wave data. When the number of bits of the accumulator 31 output in the DDS 3 is represented by n, the following data is required to output a desired output frequency f as the sine wave data:

$$M+N''=f/fc \cdot 2^n$$

where fc is the oscillation frequency of the reference oscillator 7.

Figure 3:
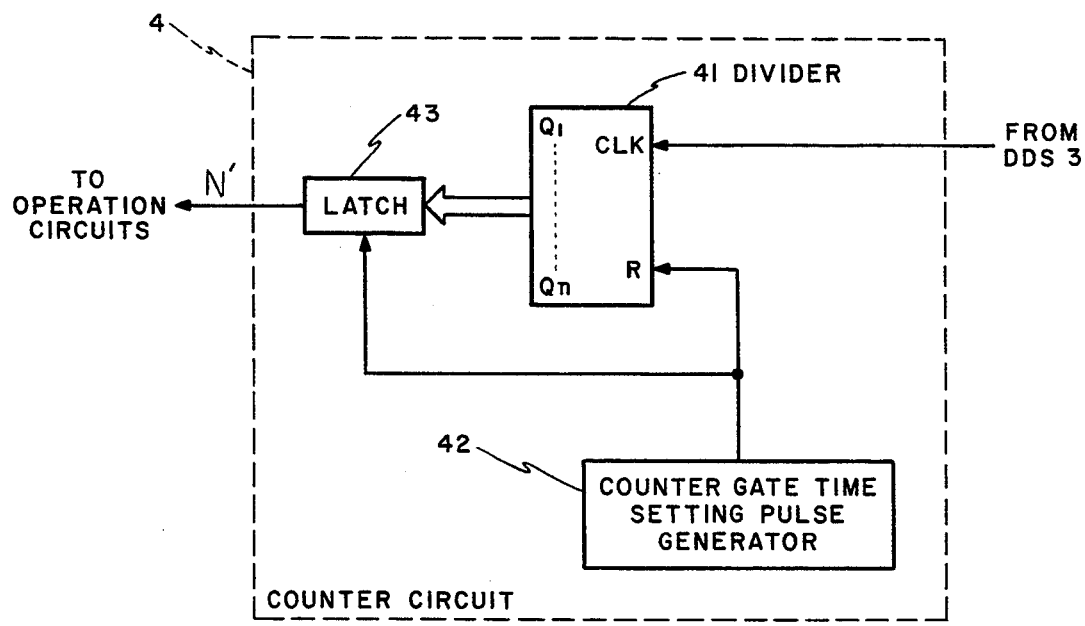
FIG. 3 is an internal block diagram of the counter circuit in FIG. 1.
Figure 4:
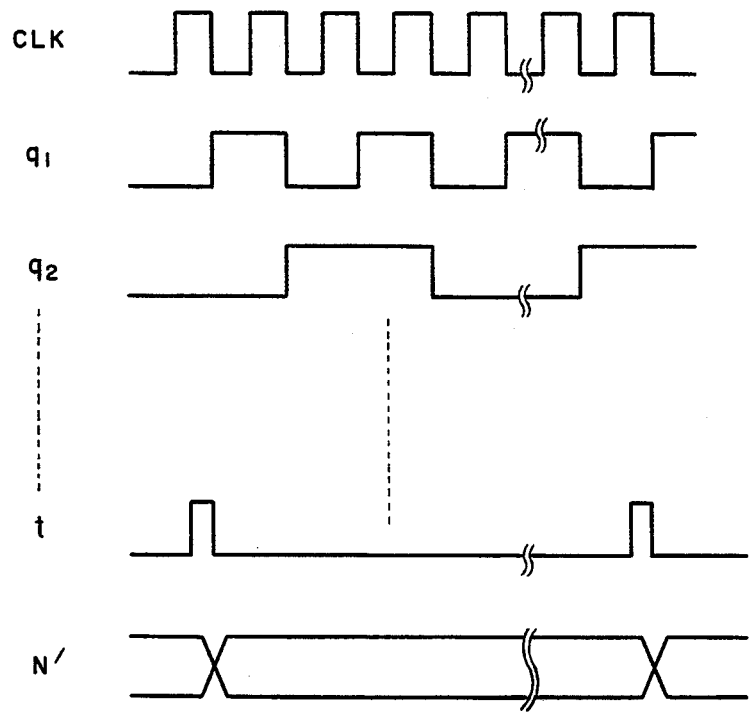
FIG. 4 is a timing chart covering various parts of the circuit shown in FIG. 3.

The counter circuit 4 consists of a divider 41, a counter gate time setting pulse generator 42 and a latching circuit 43 as shown in FIG. 3. The divider 41 receives the FM wave from the DDS 3 as a clock (FIG. 4) at a clock terminal and inputs a pulse t from the counter gate time setting pulse generater 42 as a reset signal at a reset terminal, and outputs dividing signal (q1~qn) from outputting terminal $Q_1$~$Q_n$. The latching circuit 43 latchs the dividing signals and outputs the average frequency data N' with the pulse t from the counter gate time setting pulse generater 42.

The operation unit 5 compares the center frequency data N from the center frequency data setting circuit 6 and the average frequency data N' from the counter circuit 4, and figures out the compensatory value $N-f(|N-N'|)(N-N')$, where $f(|N-N'|)$ is a monotonous positive increasing function, of which value is larger or equals 0. The multiplication of the function value accelerates convergence of average frequency to a desired frequency. Then the operation unit 5 calculates the addition data $N''=N-f(|N-N'|)(N-N')$ by compensating the center frequency data from the center frequency setting circuit 6 with the compensatory value, and supplies the addition data to the adder 2.

In this way, the present invention makes it possible to equalize the average frequency of the FM wave to its center frequency by monitoring the average frequency of the FM wave, which is the output of the DDS 3, and altering the addition data instead of referring to variations in the frequency, amplitude or the like of the modulation signal, which is the input signal to the digital FM modulator.

Incidentally, this digital FM modulator can be integrated by structuring the center frequency data setting circuit, the counter circuit and the operation unit of digital circuits.

What is claimed is:

1. A digital FM modulator having:

means for adding a modulation signal and a resultant center frequency data of a frequency modulated (FM) wave, and for supplying an addition signal;

means for receiving said addition signal, and outputting said FM wave;

center frequency data setting means for generating primary center frequency data; and control means for controlling said primary center frequency data delivered from said center frequency data setting means so as to make an average frequency and a center frequency of said FM wave substantially identical with each other, and supplying said resultant center frequency data to means for supplying said addition signal, said resultant center frequency data are represented by $\{N-f(|N-N'|).(N-N')\}$ where N corresponds to said primary center frequency data; N' said average frequency; and $f(|N-N'|)$ a monotonous positive increasing function, wherein said control means further comprises:

counter means for figuring out the average frequency of the FM wave from said FM wave outputting means, operation means for outputting said resultant center frequency data from said average frequency and said primary center frequency data from said center frequency data setting means;

said means for outputting said FM wave being:

a direct digital synthesizer (DDS) comprising an:

accumulating means for accumulating said addition signal in a sampling period and outputting accumulated signals, and memory means for storing sine wave data corresponding to said FM wave and, having said accumulated signals as its address input, outputting said sine wave data.

* * * * *